(12) United States Patent
Bae et al.

(10) Patent No.: US 11,150,307 B2
(45) Date of Patent: Oct. 19, 2021

(54) APPARATUS AND METHOD FOR DIAGNOSING BATTERY

(71) Applicant: LG Chem, Ltd., Seoul (KR)

(72) Inventors: Yoon-Jung Bae, Daejeon (KR); Dae-Soo Kim, Daejeon (KR); Dong-Kyu Kim, Daejeon (KR); Ji-Yeon Kim, Daejeon (KR); Jae-Hyun Lee, Daejeon (KR)

(73) Assignee: LG Chem, Ltd.

( * ) Notice: Subject to any disclaimer, the term of this patent is extended or adjusted under 35 U.S.C. 154(b) by 12 days.

(21) Appl. No.: 16/643,907

(22) PCT Filed: Apr. 10, 2019

(86) PCT No.: PCT/KR2019/004289
§ 371 (c)(1),
(2) Date: Mar. 3, 2020

(87) PCT Pub. No.: WO2019/199058
PCT Pub. Date: Oct. 17, 2019

(65) Prior Publication Data
US 2020/0271727 A1    Aug. 27, 2020

(30) Foreign Application Priority Data
Apr. 10, 2018 (KR) .................. 10-2018-0041691

(51) Int. Cl.
*G01R 31/389* (2019.01)
*G01R 31/3835* (2019.01)
*G01R 31/367* (2019.01)

(52) U.S. Cl.
CPC ......... *G01R 31/389* (2019.01); *G01R 31/367* (2019.01); *G01R 31/3835* (2019.01)

(58) Field of Classification Search
CPC . G01R 31/389; G01R 31/3835; G01R 31/367
See application file for complete search history.

(56) References Cited

U.S. PATENT DOCUMENTS 9,461,490 B2    10/2016   Ying
2009/0243548 A1  10/2009  Hoff
(Continued)

FOREIGN PATENT DOCUMENTS

CN    1437031 A    8/2003
CN    103969590 A  8/2014
(Continued)

OTHER PUBLICATIONS

International Search Report for PCT/KR2019/004289 dated Jul. 25, 2019.
(Continued)

*Primary Examiner* — Manuel L Barbee
(74) *Attorney, Agent, or Firm* — Lerner, David, Littenberg, Krumholz & Mentlik, LLP (57) ABSTRACT

A apparatus for diagnosing battery includes a sensing unit configured to measure a voltage of a battery and a processor configured to estimate a state of charge (SOC) of the battery, detect a plurality of inflection data from SOC-voltage data of the battery where the voltage received from the sensing unit and the estimated SOC are mapped, calculate a differential coefficient increase or decrease rate at each of the plurality of inflection data detected based on a preset reference differential coefficient, diagnose a change of an electrode reaction resistance of the battery depending on whether the plurality of calculated differential coefficient increase or decrease rates belong to a preset reference increase or decrease rate range, and adjust the magnitude of a charge or discharge current of the battery only when it is diagnosed that the electrode reaction resistance is increased.

10 Claims, 7 Drawing Sheets

(56) References Cited

U.S. PATENT DOCUMENTS

| | | |
|---|---|---|
| 2012/0226455 A1 | 9/2012 | Kumashiro et al. |
| 2013/0314050 A1* | 11/2013 | Matsubara ............... H02J 7/00 320/134 |
| 2014/0217987 A1 | 8/2014 | Shim et al. |
| 2015/0051854 A1 | 2/2015 | Joe et al. |
| 2015/0100260 A1 | 4/2015 | Joe et al. |
| 2015/0147614 A1 | 5/2015 | Wang et al. |
| 2015/0226809 A1 | 8/2015 | Joe et al. |
| 2015/0285866 A1 | 10/2015 | Frost et al. |
| 2016/0061908 A1 | 3/2016 | Torai et al. |
| 2017/0234930 A1 | 8/2017 | Lee et al. |
| 2017/0259687 A1 | 9/2017 | Chikkannanavar et al. |
| 2017/0279171 A1 | 9/2017 | Ishibashi |

FOREIGN PATENT DOCUMENTS

| | | |
|---|---|---|
| CN | 104364669 A | 2/2015 |
| CN | 104662432 A | 5/2015 |
| CN | 104871021 A | 8/2015 |
| CN | 104977541 A | 10/2015 |
| DE | 102016000988 A1 | 6/2017 |
| EP | 2239804 A2 | 10/2010 |
| EP | 3287801 A | 2/2018 |
| JP | 2004031254 A | 1/2004 |
| JP | 2016053564 A | 4/2016 |
| JP | 2017067790 A | 4/2017 |
| KR | 20100131002 A | 12/2010 |
| KR | 20170023583 A | 3/2017 |
| KR | 20170045730 A | 4/2017 |
| KR | 20170073314 A | 6/2017 |
| WO | 2016147572 A1 | 9/2016 |

OTHER PUBLICATIONS

Extended European Search Report including Written Opinion for Application No. EP19786006.7 dated Dec. 10, 2020, 12 pgs.

Jiang et al, "An Optimal Charging Method for Li-Ion Batteries Using a Fuzzy-Control Approach Based on Polarization Properties", IEEE Transactions on Vehicular Technology, vol. 62, No. 7, Sep. 1, 2013, p. 3000-3009.

S.G. Tesfahunegn et al., "A Simplified Battery Charge Controller for Safety and Increased Utilization in Standalone PV Applications", IEEE, Photovoltaic Specialists Conference, Jun. 19, 2011, pp. 2441-2447.

Search Report from First Office Action for Chinese Application No. 201980004766.8 dated Aug. 30, 2021; 3 pages.

* cited by examiner

APPARATUS AND METHOD FOR DIAGNOSING BATTERY

CROSS-REFERENCE TO RELATED APPLICATIONS

The present application is a national phase entry under 35 U.S.C. § 371 of International Application No. PCT/KR2019/004289 filed Apr. 10, 2019, published in Korean, which claims priority from Korean Patent Application 10-2018-0041691 filed Apr. 10, 2018, all of which are incorporated herein by reference.

TECHNICAL FIELD

The present disclosure relates to a apparatus and method for diagnosing battery, and more particularly, to a apparatus and method for diagnosing battery for diagnosing a change of an electrode reaction resistance of a battery.

BACKGROUND ART

A secondary battery generates electric energy through electrochemical oxidation and reduction reactions and is used in a wide variety of applications. For example, the use area of the secondary battery is gradually expanding to portable devices capable of being carried in a human hand, such as a cellular phone, a laptop computer, a digital camera, a video camera, a tablet computer, or a power tool; various electricity-driven devices such as an electric bicycle, an electric motorcycle, an electric vehicle, a hybrid electric vehicle, an electric boat, or an electric plane; power storage devices used for storing power generated by renewable energy or surplus generated power; power supply devices for stably supplying power to various information communication devices including a server computer and a base station for communication; and the like.

The secondary battery includes three basic components, namely a negative electrode (anode) containing a substance that is oxidized while discharging electrons during discharge, a positive electrode (cathode) containing a substance that is reduced while accepting electrons during discharge, and an electrolyte that allows ion transfer between the negative electrode and the positive electrode. The battery may be classified as a primary battery that is not reusable after being discharged and a secondary battery that allows repeated charging and discharging since the electrochemical reaction is at least partly reversible.

Examples of secondary batteries known in the art include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries, and the like. Among them, the lithium secondary batteries have attracted the greatest commercial interest due to their high energy density, high battery voltage and long life, compared to other secondary batteries.

Meanwhile, an electronic device employing the secondary battery generally has a function of informing a residual usage amount by using a State of Charge (SOC) of the secondary battery. The SOC of the secondary battery is usually obtained according to SOC-voltage data on the change pattern of SOC, caused by the change of voltage of the secondary battery. Here, the voltage of the secondary battery may be an open circuit voltage of the secondary battery.

The SOC-voltage data is not only dependent on the type and capacity of the applied secondary battery but also dependent on the degradation due to use even when the type or capacity of the secondary battery is specified.

More specifically, the SOC-voltage data depends on the degradation, capacity design and type of active material of each of the positive electrode and the negative electrode of the secondary battery.

In the conventional technique for diagnosing a secondary battery by using the SOC-voltage data, only the degradation of the secondary battery is diagnosed, and it is impossible to diagnose a change of resistance against electrode reaction of the secondary battery.

SUMMARY

Technical Problem

The present disclosure is directed to providing a apparatus and method for diagnosing battery for diagnosing a change of an electrode reaction resistance of a battery by using an inflection point detected based on SOC-voltage data of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a battery, comprising: one or more sensors configured to measure a voltage of the battery, and a processor configured to estimate a state of charge (SOC) of the battery, detect a plurality of inflection points in SOC-voltage data of the battery mapping the voltage measured by the one or more sensors with the estimated SOC, for each detected inflection point, calculate a differential coefficient increase rate or a differential coefficient decrease rate based on a preset reference differential coefficient, determine a change of an electrode reaction resistance of the battery based on whether the plurality of calculated differential coefficient increase rates and differential coefficient decrease rates collectively belong to a preset reference increase rate range or to a preset reference decrease rate range, and adjust a magnitude of a charge current or a discharge current of the battery only when it is determined that the change of the electrode reaction resistance is an increase of the electrode reaction resistance.

The processor may be configured to for each detected inflection point, calculate the differential coefficient increase rate or the differential coefficient decrease rate based on a difference between a differential coefficient at the detected inflection point and the preset reference differential coefficient.

The processor may be configured to for each detected inflection point, determine whether the calculated differential coefficient increase rate or differential coefficient decrease rate belongs to the preset reference increase rate range or to the preset reference decrease rate range, and determine that the change of the electrode reaction resistance is an increase of the electrode reaction resistance only when a total number of calculated differential coefficient increase rates and differential coefficient decrease rates not included in either of the preset reference increase rate range or the preset reference decrease rate range is equal to or greater than a preset reference number.

When it is diagnosed that the electrode reaction resistance is an increase of the electrode reaction resistance, the processor may be configured to select a differential coefficient increase rate or a differential coefficient decrease rate that is not included in either of the preset reference increase rate range or the preset reference decrease rate range, and adjust the magnitude of the charge current or the discharge current of the battery based on the selected differential coefficient increase rate or the selected differential decrease rate.

The processor may be configured to adjust the magnitude of the charge current or the discharge current of the battery by increasing or decreasing the magnitude of the charge current or the discharge current of the battery by a ratio corresponding to the selected differential coefficient increase rate or the selected differential decrease rate.

The processor may be configured to select a differential coefficient increase rate or a differential coefficient decrease rate corresponding to a detected inflection point having a smallest SOC among the plurality of detected inflection points as a first differential coefficient, select a differential coefficient increase rate or a differential coefficient decrease rate corresponding to a detected inflection point having a largest SOC among the plurality of detected inflection points as a second differential coefficient, and determine whether the plurality of calculated differential coefficient increase rates and differential coefficient decrease rates collectively belong to a preset reference increase rate range or to a preset reference decrease rate range based on the calculated differential coefficient increase rate or the calculated differential coefficient decrease rate of each of the first differential coefficient and the second differential coefficient.

A battery management system according to another embodiment of the present disclosure may include the apparatus for diagnosing battery according to any of the embodiments of the present disclosure described herein.

A battery pack according to another embodiment of the present disclosure may include the apparatus for diagnosing battery according to any embodiment of the present disclosure described herein.

A method for diagnosing battery according to another embodiment of the present disclosure may comprise: measuring a voltage of a battery, estimating a SOC of the battery, detecting a plurality of inflection points in SOC-voltage data of the battery mapping the measured voltage with the estimated SOC, for each detected inflection point, calculating a differential coefficient increase rate or a differential coefficient decrease rate based on a preset reference differential coefficient, determining a change of an electrode reaction resistance of the battery based on whether the plurality of calculated differential coefficient increase rates and differential coefficient decrease rates collectively belong to a preset reference increase rate range or to a preset reference decrease rate range, and adjusting a magnitude of a charge current or a discharge current of the battery only when it is determined that the change of the electrode reaction resistance is an increase of the electrode reaction resistance.

The method may further include, when it is determined that the electrode reaction resistance is an increase of the electrode reaction resistance, select a differential coefficient increase rate or a differential coefficient decrease rate that is not included in either of the preset reference increase rate range or the preset reference decrease rate range, and adjusting the magnitude of the charge current or the discharge current of the battery based on the selected differential coefficient increase rate or the selected differential coefficient decrease rate.

Advantageous Effects

According to the present disclosure, it is possible to accurately diagnose the cause of degradation of a battery since the change of an electrode reaction resistance of the battery is diagnosed using the inflection data detected based on the SOC-voltage data of the battery.

In addition, according to the present disclosure, the magnitude of the charge or discharge current of the battery may be adjusted according to the diagnosis result. Accordingly, the charge or discharge current determined based on the present degradation degree of the battery may be applied to the battery, thereby preventing the problems such as overcharge and overdischarge in advance.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term <processor> described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
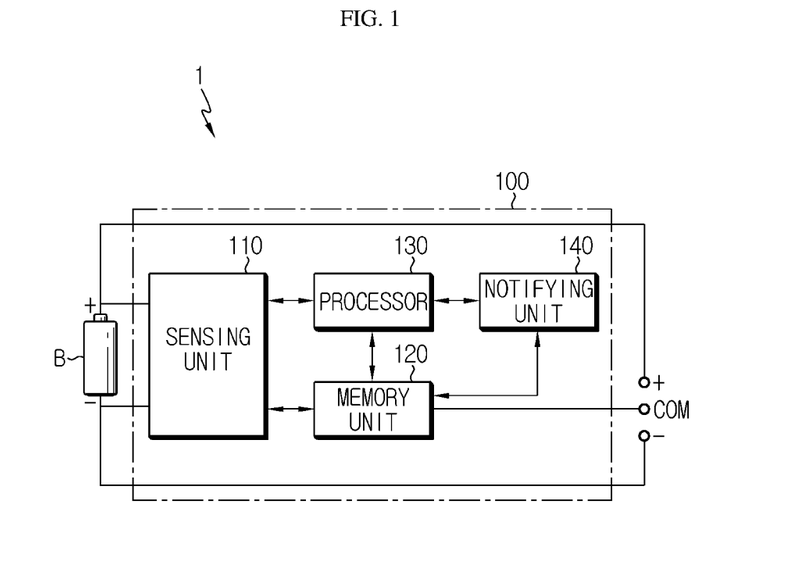
FIG. 1 is a diagram showing a apparatus for diagnosing battery according to an embodiment of the present disclosure.
Figure 2:
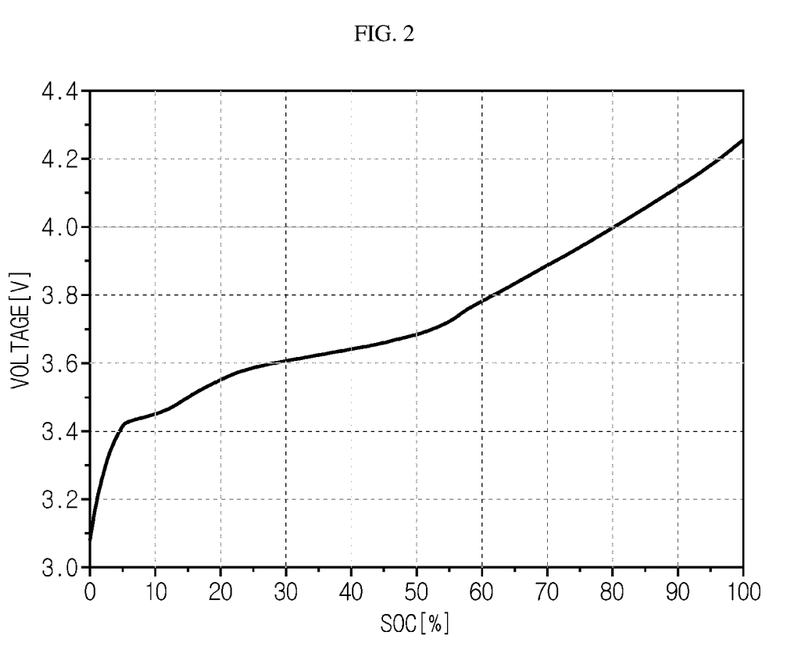
FIG. 2 is a graph showing a voltage of a battery according to a SOC of a full cell of the battery.
Figure 3:
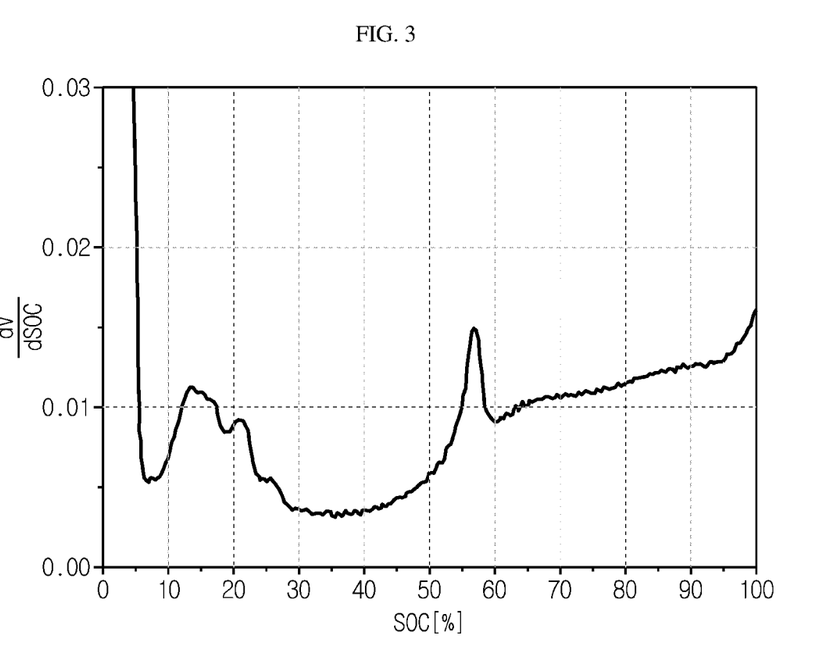
FIGS. 3 and 4 are voltage differential graphs of the battery according to the SOC of the battery before and after smoothing.
Figure 4:
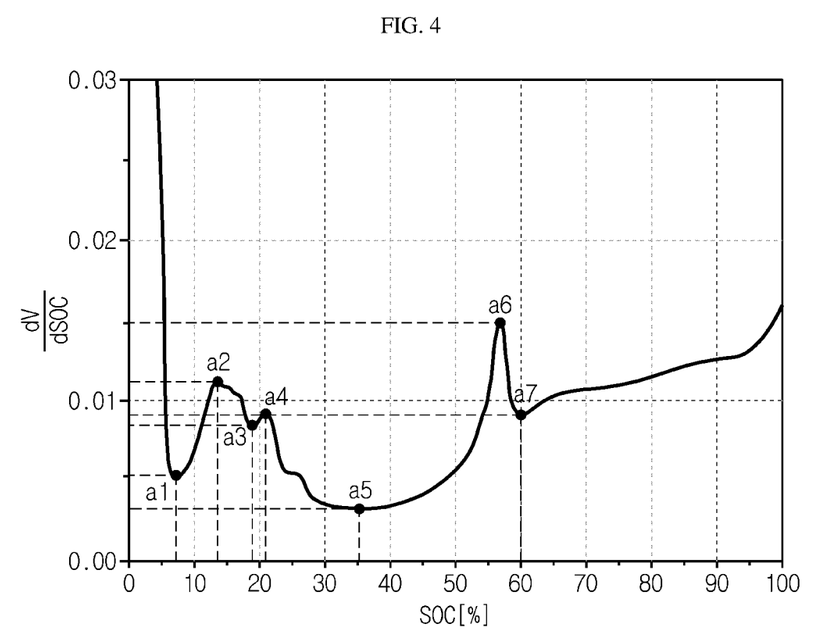
Figure 5:
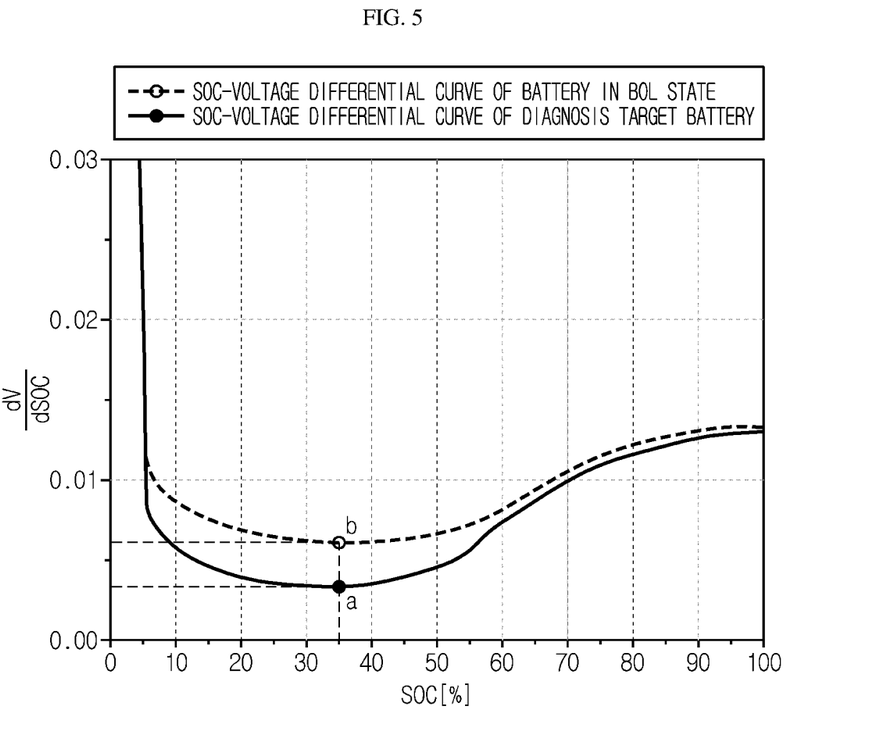
FIG. 5 is a voltage differential graph of a battery according to a SOC of a diagnosis target battery from which one inflection point is detected and a voltage differential graph of a battery according to a SOC of a battery in a BOL state.
Figure 6:
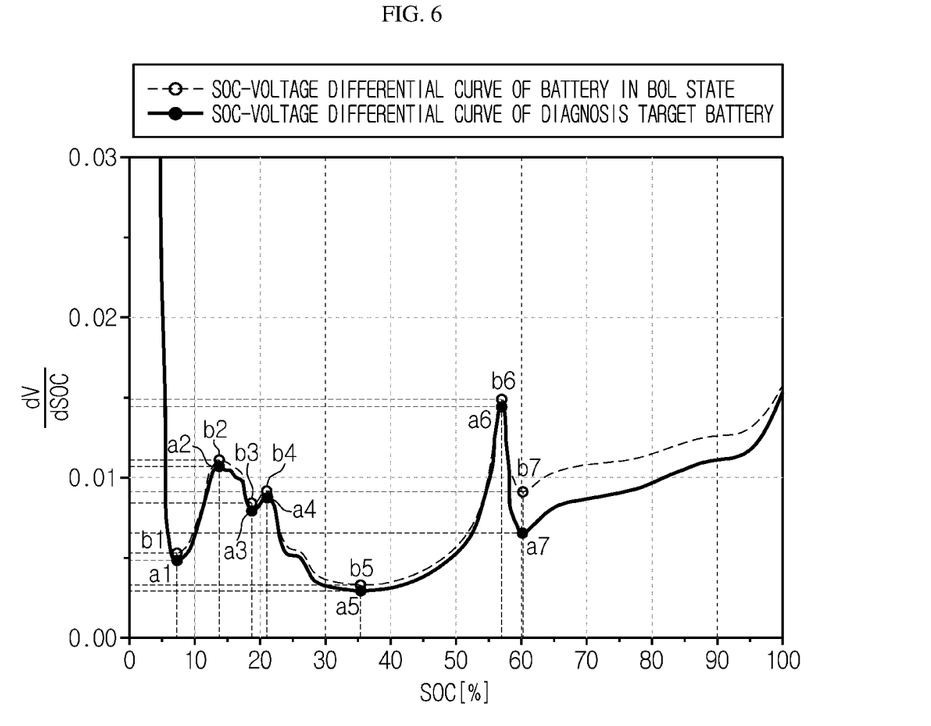
FIG. 6 is a voltage differential graph of a battery according to a SOC of a diagnosis target battery from which a plurality of inflection points are detected and a voltage differential graph of a battery according to a SOC of a battery in a BOL state.

FIG. 1 is a diagram showing a apparatus for diagnosing battery according to an embodiment of the present disclosure, FIG. 2 is a graph showing a voltage of a battery according to a SOC of a full cell of the battery, FIGS. 3 and 4 are voltage differential graphs of the battery according to the SOC of the battery before and after smoothing, FIG. 5 is a voltage differential graph of a battery according to a SOC of a diagnosis target battery from which one inflection point is detected and a voltage differential graph of a battery according to a SOC of a battery in a BOL state, and FIG. 6 is a voltage differential graph of a battery according to a SOC of a diagnosis target battery from which a plurality of inflection points are detected and a voltage differential graph of a battery according to a SOC of a battery in a BOL state.

First, referring to FIG. 1, a apparatus for diagnosing battery 100 according to an embodiment of the present disclosure may be included in a battery pack 1 that has a battery B and may be connected to the battery B to diagnose a change of an electrode reaction resistance of the battery B.

Meanwhile, the apparatus for diagnosing battery 100 according to an embodiment of the present disclosure may be included in a battery management system (BMS) provided in the battery pack 1.

The apparatus for diagnosing battery 100 may include a sensing unit 110, a memory unit 120, a processor 130 and a notifying unit 140.

The battery B is a minimum unit cell whose change of an electrode reaction resistance is diagnosed, and includes a plurality of unit cells electrically connected in series and/or in parallel. Of course, the case where the battery pack B includes only one unit cell also falls into the scope of the present disclosure. For example, the battery B may be a lithium polymer battery of a pouch type.

The battery B may be electrically coupled to various types of external devices through an external terminal. The external device may be, for example, an electric vehicle, a hybrid electric vehicle, a flying object such as a drone, a large-capacity energy storage system (ESS) included in an electrical grid, or a mobile device. In this case, the battery B may include some or all unit cells included in a modularized battery pack mounted in the external device.

The external terminal of the battery B may be selectively coupled to a charging device. The charging device may be selectively coupled to the battery B by the control of the external device to which the battery pack B is mounted.

The sensing unit 110 is operably coupled to the processor 130. That is, the sensing unit 110 may be connected to the processor 130 to transmit an electrical signal to the processor 130 or receive an electrical signal from the processor 130.

The sensing unit 110 may repeatedly measure a voltage applied between a positive electrode and a negative electrode of the battery B and a current flowing into or out of the battery B at predetermined intervals, and provide a measurement signal indicating the measured voltage and current to the processor 130.

The sensing unit 110 includes a current sensor configured to measure the current of the battery B. Also, the sensing unit 110 may further include a voltage sensor configured to measure the voltage of the battery B. Though not shown in FIG. 1, the current sensor may be connected to both ends of a sense resistor connected to the battery B through a circuit. That is, the current sensor may measure a potential difference between both ends of the sense resistor and measure the current of the battery B based on the measured potential difference and the resistance value of the sense resistor.

When the processor 130 receives the measurement signal from the sensing unit 110, the processor 130 may determine a digital value of each of voltage and current of the battery through signal processing, and store the digital value in the memory unit 120.

The memory unit 120 is a semiconductor memory device that records, erases and updates data generated by the processor 130, and stores a plurality of program codes prepared for diagnosing a change of an electrode reaction resistance of the battery B. In addition, the memory unit 120 may store preset values of various predetermined parameters used in implementing the present disclosure.

The memory unit 120 may is not particularly limited as long as it is a semiconductor memory element known in the art as being capable of recording, erasing and updating data. For example, the memory unit 120 may be dynamic random-access memory (DRAM), synchronous dynamic-random access memory (SDRAM), a flash memory, read-only memory (ROM), electrically erasable programmable read-only memory (EEPROM), a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

The processor 130 may control the current of the battery B so that the current of a preset charging current value is inputted to the battery B to charge the battery B, and estimate a State Of Charge (SOC) of the battery B based on the current input to the battery B.

At this time, the preset charging current value may be calculated using Equation 1 below.

$$I_C = \alpha \times C_n \quad \text{[Equation 1]}$$

Here, Ic may be a preset charging current value, $\alpha$ may be a constant of 1 or less, and Cn may be a rated current of the battery.

Accordingly, the processor 130 may estimate the SOC of the battery B which is charged by receiving the current having a charging current value equal to or less than the rated current.

Meanwhile, the SOC of the battery B may be a ratio of a charged capacity to the total capacity of the battery B.

The processor 130 may estimate the SOC of the battery B by using a current integration method that integrates current values of the current input to the battery B.

Even though it has been described that the processor 130 estimates the SOC of the battery B by using the current integration method, the estimation method is not limited thereto as long as the SOC of the battery B to which the current of a preset charging current value is input can be estimated.

Meanwhile, the processor 130 may generate SOC-voltage data of the battery B by mapping the voltage of the battery B with the estimated SOC of the battery B.

Here, the voltage of the battery B may be an open circuit voltage of the battery B.

The SOC-voltage data of the battery B may be expressed using a voltage curve of the battery B according to the SOC of the battery B, as shown in FIG. 2.

At this time, the memory unit 120 may store the SOC-voltage data of the battery B in at least one form of an approximation function that approximates the SOC-voltage data of the battery B to the voltage curve of the battery B according to the SOC of the battery B and a lookup table where the voltage of the battery B is mapped with each SOC of the battery B.

The processor 130 may detect a plurality of inflection points from the SOC-voltage data of the battery B and detect a plurality of inflection data about the voltage and SOC about the plurality of inflection points. Namely, the inflection data may include a voltage and a SOC at an inflection point in a SOC-voltage curve expressed based on the SOC-voltage data.

Specifically, the processor 130 may detect the SOC and the voltage of the battery B at a point where the change of the voltage of the battery B increases and then decreases according to a minute change of the SOC based on the SOC-voltage data as the inflection data. Also, the processor 130 may detect the SOC and the voltage of the battery B at a point where the change of the voltage of the battery B decreases and then increases according to the minute change of the SOC based on the SOC-voltage data as the inflection data. That is, the processor 130 may detect the SOC where a second-order derivative coefficient of an approximation function corresponding to the SOC-voltage data of the battery B is "0" and the voltage of the battery B corresponding to the SOC as the inflection point.

To this end, the processor 130 may calculate a first-order derivative by differentiating the approximation function corresponding to the SOC-voltage data of the battery B, as shown in FIG. 3.

After that, the processor 130 may remove noise components by smoothing the first-order derivative of the approximation function corresponding to the SOC-voltage data of the battery B, as shown in FIG. 4. At this time, the processor 130 may smooth the first-order derivative of the approximation function corresponding to the SOC-voltage data of the battery B by using a noise filter. In this way, the processor 130 may prevent false detection of the inflection point caused by noise components, thereby improving the accuracy of inflection point detection.

Subsequently, the processor 130 may calculate a second-order derivative by differentiating the first-order derivative of the smoothed approximation function, and detect the SOC where a function value of the calculated second-order derivative is "0" and the voltage of the battery B corresponding to the SOC as the inflection data.

For example, as shown in FIG. 4, the processor 130 may detect seven inflection points a1 to a7, and the SOC corresponding to the seven inflection points a1 to a7 may be "7.2%", "13.6%", "19.1%", "21.2%", "35.3%", "56.8%" and "60.0%", respectively. Also, the differential coefficients corresponding to seven inflection points a1 to a7 detected by the processor 130 may be "0.005", "0.011", "0.0085", "0.009", "0.003", "0.015" and "0.009", respectively. Here, the differential coefficient may be a function value of a first-order derivative at the detected inflection point. Namely, the differential coefficient may be a Y-axis value in FIGS. 3 and 4, which is expressed as dV/dSOC.

The processor 130 may calculate a differential coefficient increase or decrease rate at each of the plurality of inflection data detected based on a preset reference differential coefficient.

Here, the preset reference differential coefficient may be a differential coefficient of the inflection data detected from the SOC-voltage data of a battery B in a beginning of life (BOL) state without degradation.

That is, the processor 130 may use the differential coefficient obtained from the battery in a BOL state as the reference differential coefficient, identical to the above method for obtaining a differential coefficient from the battery B that is a diagnosis target.

At this time, the processor 130 may calculate the differential coefficient increase or decrease rate by using Equation 2 below.

$$I = \left(\frac{D_b - D_{ref}}{D_{ref}}\right) \times 100 \quad \text{[Equation 2]}$$

Here, I is a differential coefficient increase or decrease rate, Db is a differential coefficient of the detected inflection data, and Dref is a preset reference differential coefficient. Also, Db and Dref may be differential coefficients for the same SOC. For example, in the embodiment of FIG. 5, Db may be a Y-axis value of a, and Dref may be a Y-axis value of b.

After that, the processor 130 may diagnose the change of an electrode reaction resistance of the battery B depending on whether the plurality of calculated differential coefficient increase or decrease rates belong to a preset reference range.

Here, the electrode reaction resistance may be a parameter indicating whether a reaction rate of the electrode reaction occurring at an interface between an electrode and a solution is decreased to a reference reaction rate or below since an organic material layer or a gas layer is generated at the electrode due to the degradation of the battery B. For example, if the electrode reaction resistance is increased, an organic material layer or a gas layer may be generated due to the degradation of the battery B to reduce the reaction rate of the electrode reaction.

For example, the processor 130 may diagnose that the electrode reaction resistance of the battery B is increased if some of the plurality of calculated differential coefficient increase or decrease rates do not belong to a preset reference increase or decrease rate range. On the contrary, the processor 130 may diagnose that the electrode reaction resistance of the battery B is not increased if all of the plurality of calculated differential coefficient increase or decrease rates belong to the preset reference increase or decrease rate range.

Here, the preset reference increase or decrease rate range may be a range of "−10% or above and 0% or below". For example, if the differential coefficient at the inflection data is increased over the preset reference differential coefficient, this may correspond to a case where the electrode reaction resistance of the battery B is decreased. On the contrary, if the differential coefficient at the inflection data is decreased below the preset reference differential coefficient, this may correspond to a case where the electrode reaction resistance of the battery B is increased.

For example, referring to FIG. 5, the processor 130 may detect inflection data (a) from the SOC-voltage data of the battery B. Here, the inflection data (a) may be an inflection point in the SOC-voltage curve. The processor 130 may read a differential coefficient corresponding to inflection data (a) by using the SOC-voltage data of the battery B. That is, the processor 130 may read the dV/dSOC value "0.003" corresponding to the inflection data (a). In addition, the processor 130 may calculate a differential coefficient increase or decrease rate of the inflection data (a) by using the differential coefficient "0.006" of the inflection data (b) detected in advance from the SOC-voltage data of the battery in a BOL state. Here, the processor 130 may calculate the differential coefficient increase or decrease rate of the inflection data (a) as "−50%" by using Equation 2.

The processor 130 may diagnose the change of the electrode reaction resistance of the battery B depending on whether the calculated differential coefficient increase or decrease rate is included in the preset reference increase or decrease rate range. For example, in the former embodiment, the processor 130 may determine that the calculated differential coefficient increase or decrease rate "−50%" is not included in the preset reference increase or decrease rate range "−10% or above and 0% or below". The processor 130 may diagnose that the electrode reaction resistance of the battery B is increased.

According to the configuration of the present disclosure, it is possible to accurately diagnose whether the battery B is degraded due to an increase of the electrode reaction resistance by using the increase or decrease of the differential coefficient at the inflection point detected from the SOC-voltage data of the battery B.

In addition, the processor 130 may be configured to adjust the magnitude of a charge or discharge current of the battery only when it is diagnosed that the electrode reaction resistance of the battery B is increased. Specifically, if the calculated differential coefficient increase or decrease rate is not included in the preset reference increase or decrease rate range, the processor 130 may adjust the magnitude of the charge or discharge current of a preset battery based on the calculated differential coefficient increase or decrease rate.

For example, if the calculated differential coefficient increase or decrease rate is "−50%" as in the former embodiment, the processor 130 may reduce the magnitude of the charge or discharge current of the preset battery by 50%. Thus, the battery diagnosis apparatus according to an embodiment of the present disclosure may prevent unexpected problems such as overcharge or overdischarge in advance.

Hereinafter, a case where a plurality of inflection data are detected will be described in detail.

If a plurality of inflection data are detected from the SOC-voltage data of the battery B, the processor 130 may read a differential coefficient at each of the detected plurality of inflection data and calculate increase or decrease rates of the plurality of read differential coefficients.

For example, as shown in FIG. 6, when detecting a plurality of inflection data a1 to a7 from the SOC-voltage data of the battery B, a processor 130 according to another embodiment may read Y-axis values at the plurality of detected inflection data a1 to a7 as differential coefficients. For example, the differential coefficients at the plurality of inflection data a1 to a7 may be "0.0045", "0.0105", "0.0080", "0.0085", "0.0025", "0.0145" and "0.0056".

After that, the processor 130 may calculate a differential coefficient increase or decrease rate by using a difference between the reference differential coefficients "0.005", "0.011", "0.0085", "0.009", "0.003", "0.015" and "0.009" at a plurality of inflection data b1 to b7 detected from the SOC-voltage data of the battery in a BOL state and the differential coefficients "0.0045", "0.0105", "0.008", "0.0085", "0.0025", "0.0145" and "0.0056" at the plurality of detected inflection data a1 to a7.

Here, the inflection data a1 to a7 may correspond to the same SOC as the inflection data b1 to b7. For example, the inflection data a1 and b1 may have the same SOC, the inflection data a2 and b2 may have the same SOC, and the SOC of the inflection data a3 to a7 may be identical to the SOC of the inflection data b3 to b7.

At this time, the processor 130 may calculate an increase or decrease rate of each of the differential coefficients "0.0045", "0.0105", "0.008", "0.0085", "0.0025", "0.0145" and "0.0056" corresponding to the plurality of inflection data a1 to a7 detected from the SOC-voltage data of the battery B by using Equation 2.

The processor 130 may calculate the differential coefficient increase or decrease rates of the plurality of differential coefficients "0.0045", "0.0105", "0.0080", "0.0085", "0.0025", "0.0145" and "0.0056" at the plurality of inflection data a1 to a7 detected from the SOC-voltage data of the battery B as "−10%", "−4.54%", "−5.88%", "−5.56%", "−16.67%", "−3.33%" and "−37.78%", respectively.

The processor 130 may determine whether each of the plurality of calculated increase or decrease rates belongs to the preset reference increase or decrease rate range, and diagnose the change of the electrode reaction resistance of the battery B based on the number of differential coefficient increase or decrease rates not included in the preset reference increase or decrease rate range among the plurality of differential coefficient increase or decrease rates. Namely, the processor 130 may diagnose that the electrode reaction resistance of the battery B is increased if the number of increase or decrease rates not included in the reference increase or decrease rate range among the plurality of differential coefficient increase or decrease rates is a preset reference number or above.

For example, it is assumed that the preset reference number is 1. As in the above example, the processor 130 may calculate the plurality of differential coefficient increase or decrease rates "−10%", "−4.54%", "−5.88%", "−5.56%", "−16.67%", "−3.33%" and "−37.78%". In addition, the processor 130 may calculate that the number of differential coefficient increase or decrease rates belonging to the preset reference increase or decrease rate range "−10% or above and 0% or below" among the calculated differential coefficient increase or decrease rates is 5. Namely, among the seven calculated differential coefficient increase or decrease rates, two differential coefficient increase or decrease rates may not belong to the preset differential coefficient increase or decrease rate range. Since the number of differential coefficient increase or decrease rates belonging to the preset differential coefficient increase or decrease rate range among the calculated differential coefficient increase or decrease rates is greater than the preset reference number, the processor 130 may diagnose that the electrode reaction resistance of the battery B is increased.

In addition, the processor 130 may select an increase or decrease rate having a largest absolute value among the calculated differential coefficient increase or decrease rates, and adjust the magnitude of the preset charge or discharge current of the battery B based on the selected increase or decrease rate.

For example, in the former embodiment, the processor 130 may select "−37.78%" as the differential coefficient increase or decrease rate having a largest magnitude. In addition, the processor 130 may reduce the magnitude of the preset charge or discharge current of the battery B by 37.78%.

Meanwhile, if the plurality of inflection data is detected from the SOC-voltage data of the battery B, the processor 130 may diagnose the change of the electrode reaction resistance of the battery B by using a differential coefficient at some of the plurality of detected inflection data. Specifically, the processor 130 may select an n number of inflection data having a largest SOC among the plurality of detected inflection data, and select the differential coefficients at the n number of selected inflection data as a first differential coefficient to an $n^{th}$ differential coefficient. Here, n may be a preset number.

For example, it is assumed that the n is set as 2. In the embodiment of FIG. 6, the processor 130 may select two inflection data having largest SOCs among the plurality of inflection data a1 to a7 detected from the SOC-voltage data of the battery B. In this case, the processor 130 may select the differential coefficient "0.0056" of the inflection data "a7" as the first differential coefficient, and select the differential coefficient "0.0145" of the inflection data "a6" as the second differential coefficient.

After that, the processor 130 may calculate a first differential coefficient increase or decrease rate based on the first differential coefficient and calculate a second differential coefficient increase or decrease rate based on the second differential coefficient, by using Equation 2.

Specifically, the processor 130 may select the inflection data "b7" and "b6" respectively corresponding to the inflection data "a7" and "a6" among the plurality of inflection data b1 to b7 detected from the SOC-voltage data of the battery in a BOL state. In addition, the processor 130 may read the reference differential coefficient "0.009" corresponding to the inflection data "b7" and the reference differential coefficient "0.015" corresponding to the inflection data "b6". After that, the processor 130 may calculate the first differential coefficient increase or decrease rate as "−37.78%" and calculate the second differential coefficient increase or decrease rate as "−3.3%" by using Equation 2.

If the preset number is set as 1 as in the former embodiment and the reference increase or decrease rate range is set as "−10% or above and 0% or below", since the first differential coefficient increase or decrease rate does not belong to the preset reference increase or decrease rate range among the first differential coefficient increase or decrease rate and the second differential coefficient increase or decrease rate, the processor 130 may diagnose that the electrode reaction resistance of the battery B is increased. In addition, the processor 130 may reduce the magnitude of the preset charge or discharge current of the battery B by 37.78%. Namely, if the preset charge current has a magnitude of 1C, the processor 130 may reduce the magnitude of the charge current to 0.6221C.

Thus, the battery diagnosis apparatus according to an embodiment of the present disclosure may quickly and easily diagnose the change of the electrode reaction resistance of the battery B by using only the differential coefficients corresponding to some inflection data sensitive to the degradation of the battery B, instead of using the differential coefficients corresponding to all the inflection data detected from the SOC-voltage data of the battery B.

Meanwhile, the processor 130 according to another embodiment may classify the inflection data detected from the SOC-voltage data of the battery B into any one of a first inflection data group and a second inflection data group. Here, the first inflection data group may be a point at which the change of the voltage of the battery B according to a minute change of the SOC increases and then decreases, and the second inflection data group may be a point at which the change of the voltage of the battery B according to a minute change of the SOC decreases and then increases. For example, in the embodiment of FIG. 4, the inflection data a1, a3, a5 and a7 may be classified into the first inflection data group, and the inflection data a2, a4 and a6 may be classified into the second inflection data group.

After that, the processor 130 may calculate the differential coefficient increase or decrease rate at the inflection data belonging to the first inflection data group and the second inflection data group.

The processor 130 may determine whether each differential coefficient increase or decrease rate at the plurality of inflection data belonging to the first inflection data group is less than the preset first reference increase or decrease rate and determine whether each differential coefficient increase or decrease rate at the plurality of inflection data belonging to the second inflection data group is greater than the preset second reference increase or decrease rate.

Specifically, the processor 130 may diagnose the change of the electrode reaction resistance of the battery B based on the sum of the number of differential coefficient increase or decrease rates less than the first reference increase or decrease rate among the differential coefficient increase or decrease rates at the plurality of inflection data belonging to the first inflection data group and the number of differential coefficient increase or decrease rates greater than second reference increase or decrease rate among the differential coefficient increase or decrease rates at the plurality of inflection data belonging to the second inflection data group.

For example, similar to the former embodiment, it is assumed that the preset reference number is set as 1 and also the differential coefficient increase or decrease rates corresponding to the inflection data a1 to a7 are calculated as "−10%", "−4.54%", "−5.88%", "−5.56%", "−16.67%", "−3.33%" and "−37.78%", respectively. Also, it is assumed that the first reference increase or decrease rate is set as "−10%" and the second reference increase or decrease rate is set as "10%". The processor 130 may select "a5" and "a7" as the inflection data whose differential coefficient increase or decrease rate is less than the first reference increase or decrease rate among the plurality of inflection data a1, a3, a5 and a7 belonging to the first inflection data group. In addition, the processor 130 may select no inflection data as the inflection data whose differential coefficient increase or decrease rate is greater than the second reference increase or decrease rate among the plurality of inflection data a2, a4 and a6 belonging to the second inflection data group. Namely, the processor 130 may select two inflection data in total. In addition, since the number of selected inflection data is greater than the preset reference number, the processor 130 may diagnose that the electrode reaction resistance of the battery B is increased.

That is, if the differential coefficient of the inflection data belonging to the first inflection data group is decreased by a predetermined value or above, or if the differential coefficient of the inflection data belonging to the second inflection data group is increased by a predetermined value or above, the processor 130 may diagnose that the electrode reaction resistance of the battery B is increased.

In another example, if the detected inflection data is plural, the processor 130 may select the inflection data having a smallest SOC as the first inflection data and the inflection data having a largest SOC as the second inflection data among the plurality of inflection data. In addition, the processor 130 may calculate a differential coefficient increase or decrease rate corresponding to the first inflection data and a differential coefficient increase or decrease rate corresponding to the second inflection data.

For example, in the embodiment of FIG. 6, the processor 130 may select a1 as the first inflection data and a7 as the second inflection data. In addition, the processor 130 may select the first differential coefficient "0.0045" corresponding to a1 and the second differential coefficient "0.0056" corresponding to a7.

In addition, the processor 130 may calculate a differential coefficient increase or decrease rate corresponding to the first inflection data and a differential coefficient increase or decrease rate corresponding to the second inflection data by using Equation 2. The processor 130 may calculate the differential coefficient increase or decrease rate corresponding to a1 as "−10%" and the differential coefficient increase or decrease rate corresponding to a7 as "−37.78%".

In addition, the processor 130 may determine whether each of the calculated differential coefficient increase or decrease rates is included in the preset reference increase or decrease rate range, and diagnose that the electrode reaction resistance of the battery B is increased if at least one differential coefficient increase or decrease rate is not included in the reference increase or decrease rate range.

For example, the preset reference increase or decrease rate range is assumed as "−10%" to "0%", similar to the former example. The processor 130 may determine whether the first differential coefficient increase or decrease rate "−10%" and the second differential coefficient increase or decrease rate "−37.78%", calculated in the former example, are included in the preset reference increase or decrease rate range "−10% or above and 0% or below". Namely, since the second differential coefficient increase or decrease rate "−37.78%" is not included in the present reference increase or decrease rate range, the processor 130 may determine that at least one differential coefficient increase or decrease rate is not included in the reference increase or decrease rate range and thus diagnose that the electrode reaction resistance of the battery B is increased.

Meanwhile, the processor 130 may transmit a message indicating the diagnosis result to the external device through a communication terminal (COM).

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

The notifying unit 140 may receive and output the diagnosis results obtained by the processor 130 to the outside. More specifically, the notifying unit 140 may include at least one of a display unit for displaying the diagnosis result by using at least one of symbols, numbers and codes, and a speaker unit for outputting the diagnosis result with a sound.

Meanwhile, a battery management system according to the present disclosure may include the apparatus for diagnosing battery described above. By doing so, it is possible to diagnose the change of an electrode reaction resistance of a battery managed by the battery management system.

Figure 7:
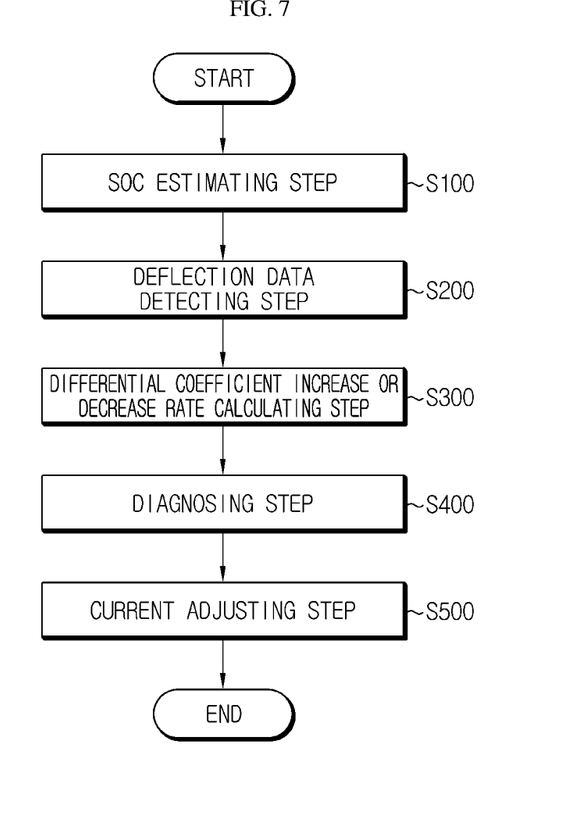
FIG. 7 is a flowchart for schematically illustrating a method for diagnosing battery according to still another embodiment of the present disclosure.

FIG. 7 is a flowchart for schematically illustrating a method for diagnosing battery according to still another embodiment of the present disclosure. Thea battery diagnosis method according to an embodiment of the present disclosure is may be performed in the apparatus for diagnosing battery.

Referring to FIG. 7, a method for diagnosing battery according to an embodiment of the present disclosure may include a SOC estimating step (S100), an inflection data detecting step (S200), a differential coefficient increase or decrease rate calculating step (S300), a diagnosing step (S400) and a current adjusting step (S500).

The SOC estimating step (S100) is a step of measuring a current and voltage of a battery B and estimating a SOC of the battery B based on the measured current. Based on the current of the battery B measured by the sensing unit 110, the processor 130 may estimate the SOC of the battery B.

First, the sensing unit 110 may measure the voltage and current of the battery B and transmit the measured voltage value and the measured current value to the processor 130. The processor 130 may receive the voltage value and the current value from the sensing unit 110 and estimate the SOC of the battery B based on the received current value.

The inflection data detecting step (S200) is a step of detecting a plurality of inflection data from SOC-voltage data of the battery where the measured voltage and the estimated SOC are mapped and may be performed by the processor 130.

For example, the processor 130 may obtain the SOC-voltage data where the voltage value received from the sensing unit 110 and the estimated SOC are mapped with each other, and extract a plurality of inflection points from the obtained SOC-voltage data.

In addition, the processor 130 may select some inflection data that satisfy the predetermined condition among the plurality of extracted inflection data. For example, the processor 130 may select only some inflection data having a largest SOC among the plurality of extracted inflection data. In addition, the processor 130 may select the inflection data having a largest SOC and the inflection data having a smallest SOC among the plurality of extracted inflection data.

Hereinafter, an example in which all of the plurality of pieces of inflection data extracted by the processor 130 are selected will be described.

The differential coefficient increase or decrease rate calculating step (S300) is a step of calculating a differential coefficient increase or decrease rate at each of the plurality of inflection data detected based on the preset reference differential coefficient, and may be performed by the processor 130.

The processor 130 may calculate the differential coefficient increase or decrease rate at each of the plurality of detected inflection data by using Equation 2.

For example, in the embodiment of FIG. 6, it is assumed that the preset reference differential coefficients at the plurality of inflection data b1 to b7 are set as "0.005", "0.011", "0.0085", "0.009", "0.003", "0.015" and "0.009", respectively. Also, it is assumed that the differential coefficients at the plurality of detected inflection data a1 to a7 are set as "0.0045", "0.0105", "0.008", "0.0085", "0.0025", "0.0145" and "0.0056", respectively.

The processor 130 may calculate the differential coefficient increase or decrease rates at the inflection data a1 to a7 as "−10%", "−4.54%", "−5.88%", "−5.56%", "−16.67%", "−3.33%" and "−37.78%", respectively, based on the preset reference differential coefficient and Equation 2.

The diagnosing step (S400) is a step of diagnosing the change of the electrode reaction resistance of the battery depending on whether the plurality of calculated differential coefficient increase or decrease rates belong to the preset reference increase or decrease rate range, and may be performed by the processor 130.

The processor 130 may calculate the differential coefficient increase or decrease rate at each of the plurality of inflection data and then determine whether the plurality of calculated differential coefficient increase or decrease rates belong to the preset reference increase or decrease rate range.

For example, in the former embodiment, it is assumed that the preset reference increase or decrease rate range is preset as the range of "−10% or above and 0% or below". The processor 130 may calculate the number of differential coefficient increase or decrease rates not belonging to the preset reference increase or decrease rate range among the differential coefficient increase or decrease rates "−10%", "−4.54%", "−5.88%", "−5.56%", "−16.67%", "−3.33%" and "−37.78%" at the inflection data a1 to a7. In this case, the processor 130 may calculate the number of differential coefficient increase or decrease rates not belonging to the preset reference increase or decrease rate range as 2.

In addition, if the calculated number exceeds the preset reference number, the processor 130 may determine that the electrode reaction resistance of the battery B is increased.

For example, in the former embodiment, assuming that the preset reference number is 1, the number of differential coefficient increase or decrease rates not belonging to the preset reference increase or decrease rate range exceeds the preset reference number, and thus the processor 130 may diagnose that the electrode reaction resistance of the battery B is increased.

The current adjusting step (S500) is a step of adjusting the magnitude of the charge or discharge current of the battery only when it is diagnosed that the electrode reaction resistance is increased, and may be performed by the processor 130.

The processor 130 may adjust the magnitude of the charge or discharge current of the battery B only when it is diagnosed that the electrode reaction resistance of the battery B is increased.

For example, in the former embodiment, since the processor 130 diagnoses that the electrode reaction resistance of the battery B is increased, the magnitude of the charge or discharge current of the battery B may be adjusted. At this time, the processor 130 may adjust the magnitude of the charge or discharge current of the battery B based on the differential coefficient increase or decrease rate having a largest absolute value. Since the differential coefficient increase or decrease rate having a largest absolute value is "−37.78%" in the former embodiment, the processor 130 may reduce the magnitude of the charge or discharge current of the battery B by 37.78%.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
B: battery
100: apparatus for diagnosing battery
110: sensing unit
120: memory unit
130: processor
140: notifying unit

What is claimed is:

1. A apparatus for diagnosing a battery, comprising:
one or more sensors configured to measure a voltage of the battery; and
a processor configured to:
  estimate a state of charge (SOC) of the battery;
  detect a plurality of inflection points in SOC-voltage data of the battery mapping the voltage measured by the one or more sensors with the estimated SOC;
  for each detected inflection point, calculate a differential coefficient increase rate or a differential coefficient decrease rate based on a preset reference differential coefficient;
  determine a change of an electrode reaction resistance of the battery based on whether the plurality of calculated differential coefficient increase rates and differential coefficient decrease rates collectively belong to a preset reference increase rate range or to a preset reference decrease rate range; and
  adjust a magnitude of a charge current or a discharge current of the battery only when it is determined that the change of the electrode reaction resistance is an increase of the electrode reaction resistance.

2. The apparatus for diagnosing battery according to claim 1,
wherein the processor is configured to, for each detected inflection point, calculate the differential coefficient increase rate or the differential coefficient decrease rate based on a difference between a differential coefficient at the detected inflection point and the preset reference differential coefficient.

3. The apparatus for diagnosing battery according to claim 1,
wherein the processor is configured to:
for each detected inflection point, determine whether the calculated differential coefficient increase rate or differential coefficient decrease rate belongs to the preset reference increase rate range or to the preset reference decrease rate range; and
determine that the change of the electrode reaction resistance is an increase of the electrode reaction resistance only when a total number of calculated differential coefficient increase rates and differential coefficient decrease rates not included in either of the preset reference increase rate range or the preset reference decrease rate range is equal to or greater than a preset reference number.

4. The apparatus for diagnosing battery according to claim 1,
wherein when it is diagnosed that the electrode reaction resistance is an increase of the electrode reaction resistance, the processor is configured to:
select a differential coefficient increase rate or a differential coefficient decrease rate that is not included in either of the preset reference increase rate range or the preset reference decrease rate range; and
adjust the magnitude of the charge current or the discharge current of the battery based on the selected differential coefficient increase rate or the selected differential decrease rate.

5. The apparatus for diagnosing battery according to claim 4,
wherein the processor is configured to adjust the magnitude of the charge current or the discharge current of the battery by increasing or decreasing the magnitude of the charge current or the discharge current of the battery by a ratio corresponding to the selected differential coefficient increase rate or the selected differential decrease rate.

6. The apparatus for diagnosing battery according to claim 1,
wherein the processor is configured to:
select a differential coefficient increase rate or a differential coefficient decrease rate corresponding to a detected inflection point having a smallest SOC among the plurality of detected inflection points as a first differential coefficient;
select a differential coefficient increase rate or a differential coefficient decrease rate corresponding to a detected inflection point having a largest SOC among the plurality of detected inflection points as a second differential coefficient; and
determine whether the plurality of calculated differential coefficient increase rates and differential coefficient decrease rates collectively belong to a preset reference increase rate range or to a preset reference decrease rate range based on the calculated differential coefficient increase rate or the calculated differential coefficient decrease rate of each of the first differential coefficient and the second differential coefficient.

7. A battery management system, comprising the apparatus for diagnosing battery according to claim 1.

8. A battery pack, comprising the apparatus for diagnosing battery according to claim 1.

9. A method for diagnosing battery, comprising:
measuring a voltage of a battery;
estimating an SOC of the battery;
detecting a plurality of inflection points in SOC-voltage data of the battery mapping the measured voltage with the estimated SOC;
for each detected inflection point, calculating a differential coefficient increase rate or a differential coefficient decrease rate based on a preset reference differential coefficient;
determining a change of an electrode reaction resistance of the battery based on whether the plurality of calculated differential coefficient increase rates and differential coefficient decrease rates collectively belong to a preset reference increase rate range or to a preset reference decrease rate range; and
adjusting a magnitude of a charge current or a discharge current of the battery only when it is determined that the change of the electrode reaction resistance is an increase of the electrode reaction resistance.

10. The method for diagnosing battery according to claim 9, further comprising:
when it is determined that the electrode reaction resistance is an increase of the electrode reaction resistance, select a differential coefficient increase rate or a differential coefficient decrease rate that is not included in either of the preset reference increase rate range or the preset reference decrease rate range; and
adjusting the magnitude of the charge current or the discharge current of the battery based on the selected differential coefficient increase rate or the selected differential coefficient decrease rate.

* * * * *